US006624880B2

(12) United States Patent
Sandström et al.

(10) Patent No.: US 6,624,880 B2
(45) Date of Patent: Sep. 23, 2003

(54) METHOD AND APPARATUS FOR MICROLITHOGRAPHY

(75) Inventors: Torbjörn Sandström, Pixbo (SE); Hubert Karl Lakner, Grossroehrsdorf (DE); Peter Dürr, Dresden (DE)

(73) Assignees: Micronic Laser Systems AB, Taby (SE); Fraunhofer-Gesellschaft Zur Forderung der Angewandten Forschung E.V., Munich (DE)

( * ) Notice: Subject to any disclaimer, the term of this patent is extended or adjusted under 35 U.S.C. 154(b) by 82 days.

(21) Appl. No.: 09/765,084

(22) Filed: Jan. 18, 2001

(65) Prior Publication Data

US 2002/0105629 A1 Aug. 8, 2002

(51) Int. Cl.$^7$ ............... G03B 27/72; G03B 27/42; G03B 27/54; G03B 27/52; B41J 2/47
(52) U.S. Cl. ............... 355/71; 355/53; 355/67; 355/43; 347/255
(58) Field of Search ............... 355/71, 53, 67, 355/40, 43; 347/135, 255, 258; 250/492.1; 359/231, 291

(56) References Cited

U.S. PATENT DOCUMENTS

| 4,441,791 A | 4/1984 | Hornbeck |
| 4,566,935 A | 1/1986 | Hornbeck |

(List continued on next page.)

FOREIGN PATENT DOCUMENTS

| WO | WO 97/05526 | 2/1997 |
| WO | WO 97/49000 | 12/1997 |
| WO | WO 98/04950 | 2/1998 |
| WO | WO 99/26097 | 5/1999 |
| WO | WO 99/67671 | 12/1999 |
| WO | WO 00/42618 | 7/2000 |

OTHER PUBLICATIONS

H. Kuck et al. "New System for Fast Submicron Laser Direct Writing" SPIE vol. 2440 pp. 506–514.
R. Seltmann et al. "New System for Fast Submicron Optical Direct Writing" Microelectronic Engineering 30 (1996) pp. 123–127.

(List continued on next page.)

Primary Examiner—Russell Adams
Assistant Examiner—Peter B Kim
(74) Attorney, Agent, or Firm—Ernest J. Beffel, Jr.; Haynes Beffel & Wolfeld LLP (57) ABSTRACT

The present invention relates to an apparatus and method for patterning a work piece arranged at an image plane and sensitive to electromagnetic radiation. Said apparatus comprising a source for emitting electromagnetic radiation directed onto a selected object plane, a computer-controlled reticle comprising a plurality of object pixels, adapted to receive said electromagnetic radiation at said selected object plane and being capable of relaying said electromagnetic radiation toward said work piece arranged at said image plane, an optical projection system comprising a Fourier filter adapted to filter said relayed radiation in a Fourier space and a first lens arrangement adapted to create essentially parallel central axis of cones of radiation onto said image plane, where every cone of radiation in a specific image pixel in said image plane corresponds to a specific object pixel in said computer-controlled reticle. The invention also relates to a method for patterning a work piece sensitive to electromagnetic radiation.

68 Claims, 9 Drawing Sheets

U.S. PATENT DOCUMENTS

| | | |
|---|---|---|
| 4,596,992 A | 6/1986 | Hornbeck |
| 4,638,309 A | 1/1987 | Ott |
| 4,680,579 A | 7/1987 | Ott |
| 4,705,361 A | 11/1987 | Frazier et al. |
| 4,710,732 A | 12/1987 | Hornbeck |
| 4,956,619 A | 9/1990 | Hornbeck |
| 5,028,939 A | 7/1991 | Hornbeck et al. |
| 5,041,851 A | 8/1991 | Nelson |
| 5,072,239 A | 12/1991 | Mitcham et al. |
| 5,148,157 A | 9/1992 | Florence |
| 5,172,262 A | 12/1992 | Hornbeck |
| 5,296,891 A | 3/1994 | Vogt et al. |
| 5,461,411 A | 10/1995 | Florence et al. |
| 5,467,146 A | 11/1995 | Huang et al. |
| 5,486,851 A | 1/1996 | Gehner et al. |
| 5,495,280 A | 2/1996 | Gehner et al. |
| 5,508,841 A | 4/1996 | Lin et al. |
| 5,539,567 A | 7/1996 | Lin et al. |
| 5,539,568 A | 7/1996 | Lin et al. |
| 5,579,151 A | 11/1996 | Cho |
| 5,629,794 A | 5/1997 | Magel et al. |
| 5,672,464 A | 9/1997 | Nelson |
| 5,691,541 A | 11/1997 | Ceglio et al. |
| 5,719,682 A | 2/1998 | Venkateswar |
| 5,842,088 A | 11/1998 | Thompson |
| 5,870,176 A | 2/1999 | Sweatt et al. |
| 5,914,818 A | 6/1999 | Tejada et al. |
| 5,936,713 A | 8/1999 | Paufler et al. |
| 6,188,427 B1 | 2/2001 | Anderson et al. |
| 6,256,086 B1 * | 7/2001 | Sumiyoshi .................... 355/53 |
| 6,268,948 B1 * | 7/2001 | Gelbart ....................... 347/135 |

OTHER PUBLICATIONS

"Viscoelastic Control Layer Spatial Light Modulators" Fraunhofer Institut Mikroelektronische Schaltungen und Systeme Sep. 1999 consisting of 2 pages.

J. Paufler et al. "High–throughput Optical Direct Write Lithography" Jun. 1997 Solid State Technology, pp. 175–182.

J. Paufler et al. "Continuous Image Writer—A New Approach to Fast Direct Writing" Summer 2000, Optical Microlithography, XIII Proceedings of SPIE vol. 4000 pp. 866–873.

J. Paufler et al. "Continuous Image Writer—A New Approach to Fast Direct Writing" Autumn 1999, Abstract for SPIE 4000—88 pp. 449–450.

* cited by examiner

METHOD AND APPARATUS FOR MICROLITHOGRAPHY

FIELD OF THE INVENTION

The present invention relates in general to techniques for forming a pattern on a work piece, and in particular to an apparatus and a method for patterning a work piece using a computer-controlled reticle.

BACKGROUND OF THE INVENTION

It is known in the current art to build precision generators using projection of spatial light modulators (SLMs) of the micro mirror type (U.S. Pat. No. 5,296,891) and WO 99/45439 of one of the same applicants as in the present application which is hereby incorporated by reference. Other types of SLMs include deflecting micro mirror devices, grating light valves, silicon light valves and liquid crystal modulators. Some relay light by reflection and others by transmission. To use an SLM in a pattern generator has a number of advantages compared to more wide-spread methods of using scanning laser spots due to the fact that the SLM is a massively parallel device and the number of pixels that can be written per second is extremely high. Compared to some types of scanners, in particular electro optic and accustom optic ones, a micro mirror SLM can be used at shorter wavelengths since it is a purely reflective device.

As the dimension of individual lines on the work piece and the separation thereof decreases the techniques for forming said pattern on said work piece have to be refined in order to meet the requirements of said pattern, such as for example the optimization of the lateral resolution and uniformity of the patterned lines over the work piece etc. Therefore, there is a need in the art for a method and an apparatus for the fabrication of said pattern on said work piece which fulfill these requirements.

SUMMARY OF THE INVENTION

In view of the foregoing background, the apparatus and method of the present invention of the present invention are useful to provide a pattern on a work piece with a line width below 1 mm, in many cases below 0.2 mm and in the foreseeable future below 50 nm. It is an object of the present invention to provide an improved apparatus and method for patterning a work piece. In a first embodiment, one aspect of the invention provides an apparatus for patterning a work piece arranged at an image plane and sensitive to electromagnetic radiation. Said apparatus may comprise a source emitting electromagnetic radiation directed onto an object plane, a computer-controlled reticle comprising a plurality of object pixels, adapted to receive said electromagnetic radiation at said object plane and to relay said electromagnetic radiation toward said work piece and an optical projection system comprising a Fourier filter adapted to filter said relayed radiation in a Fourier space and a first lens arrangement adapted to project essentially parallel central axes of cones of radiation onto said image plane. Other embodiments and aspects of the present invention are described in below and set forth in the claims.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1A:
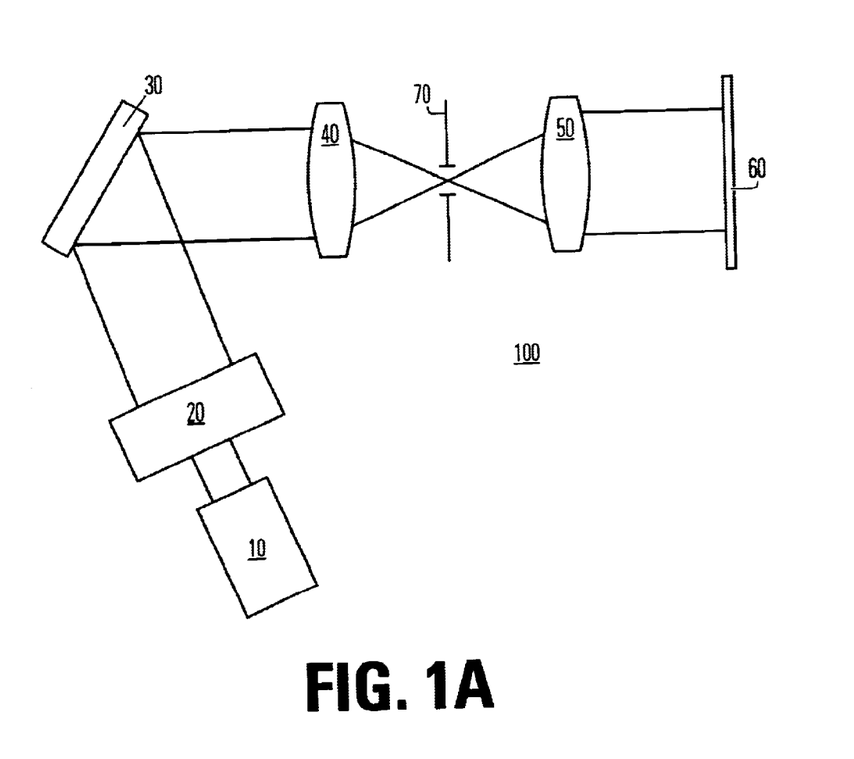
FIG. 1a shows a first embodiment of an apparatus for patterning a work piece according to the present invention.

FIG. 1 shows a first embodiment of an apparatus 100 for patterning a work piece 60 according to the present invention. Said apparatus 100 comprising a source 10 for emitting electromagnetic radiation, a first lens arrangement 50, a computer-controlled reticle 30, a beam conditioning arrangement 20, a spatial filter 70 in a Fourier plane, a third lens arrangement 40 and a work piece 60.

The source 10 may emit radiation in the range of wavelengths from infrared (IR), which is defined as 780 nm up to about 20 mm, to extreme ultraviolet (EUV), which in this application is defined as the range from 100 nm and down as far as the radiation is possible to be treated as electromagnetic radiation, i.e. reflected and focused by optical components. The source 10 emits radiation either pulsed or continuously. The emitted radiation from the continuous radiation source 10 can be formed into a pulsed radiation by means of a shutter located in the radiation path between said radiation source 10 and said computer-controlled reticle 30. As an example can the radiation source be a KrF excimer laser with a pulsed output at 248 nm, a pulse length of approximately 10 ns and a repetition rate of 500 Hz. The repetition rate may be below or above 500 Hz.

The beam conditioner unit 20 may be a simple lens or an assembly of lenses. The beam conditioning arrangement 20 distributes the radiation emitted from the radiation source 10 uniformly over a surface of the computer-controlled reticle 30. In case of a continuous radiation source a beam of such a source may be scanned over the surface of the computer-controlled reticle.

Between the radiation source 10 and the computer controlled reticle 30, which may for instance be a Spatial Light Modulator (SLM) there is a beam conditioning arrangement 20, that expands and shapes the beam to illuminate the surface of the SLM in a uniform manner. In a preferred embodiment with an excimer laser as the source the beam shape is rectangular, the beam divergence different in x-direction and y-direction and the radiation intensity is often non-uniform over the beam cross-section. The beam has to be shaped to the size of the SLM 30 and homogenized so that the rather unpredictable beam profile is converted to a flat illumination with a uniformity of 1–2%. This is done in steps: a first beam-shaping step, a homogenizing step and a second beam-shaping step. The beam is also angularly filtered and shaped so that the radiation impinging on each point on the SLM has a controlled angular subtense. This is useful for the imaging properties as will be described later.

The optics of the invention is similar to that of a wafer stepper. In steppers the beam is homogenized in a light-pipe, a rectangular or prism-shaped rod with reflecting internal walls where many mirror images of the light source are formed, so that the illumination is the superposition of many independent sources. The invention as described in this application can use light pipes for homogenization, but we have found that homogenization by splitting and recombining the beam by refractive or diffractive optical components is in many ways more practical with the particular sets of optical parameters used in the invention. A difficulty with using a light pipe is that the relatively small area of the SLM together with the high demagnification (typically 160×) makes the light path very long and narrow and a light pipe would be impractically long and narrow.

Figure 5:
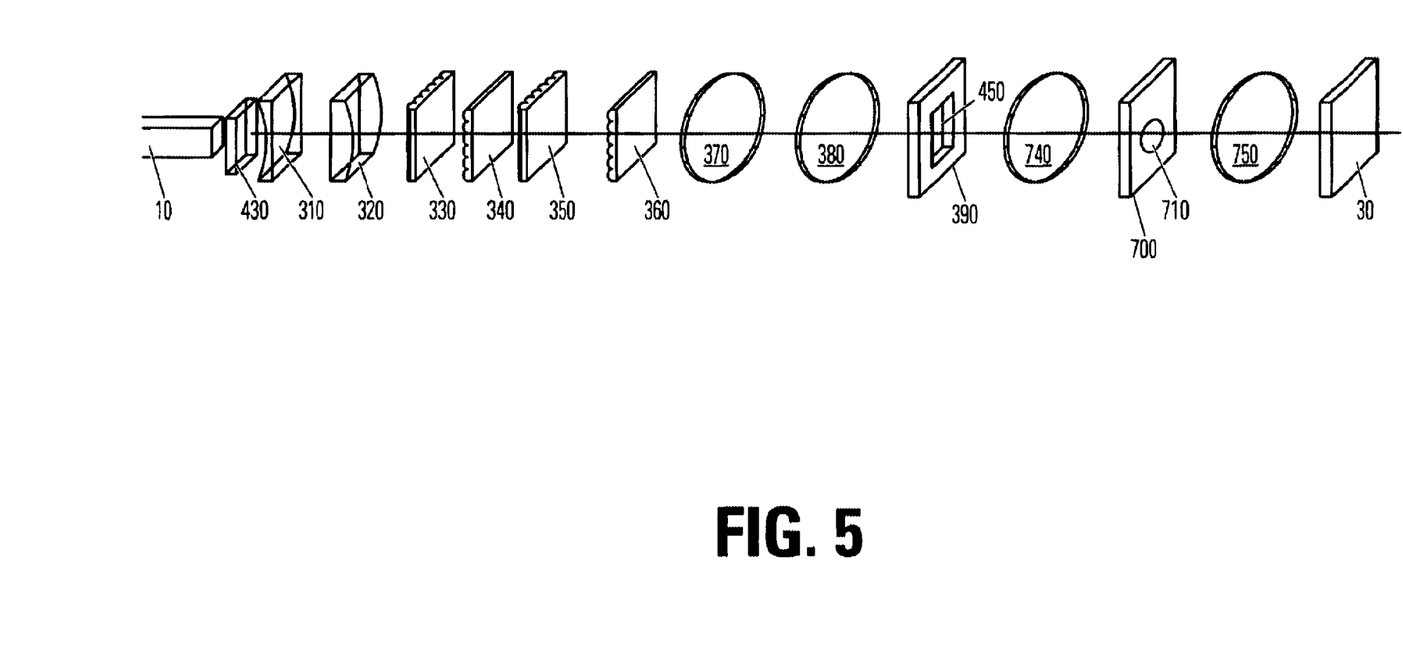
FIG. 5 shows an exploded view of an example of a beam conditioning arrangement according to the present invention.

FIG. 5 shows the parts of a beam conditioning optics of an excimer-based embodiment of the invention. The rectangular beam from the laser 10 is reshaped in the first beam-shaping step by cylinder lenses 310, 320 to a square shape in the first beam-shaping step. In the homogenizing step the square beam illuminates a first pair of cylinder lenslet arrays 330, 340 one horizontally and one vertically oriented and a second pair of cylinder lenslet arrays 350, 360 one horizontally and one vertically oriented. To understand the function the beam homogenizing step one may look at the horizontal array 340. The square but inhomogeneous illumination falls on the lenslet array and is divided into beamlets that have separated foci at one focal length's distance. After the focus the beamlets spread again and the lenses 370, 380 after the lenslet arrays 330, 340, 350, 360 direct each of them to illuminate the same area in a homogenized plane 390. The second horizontal lenslet array 360 has a focal length that is the same or nearly the same (e.g. 40 mm vs. 25 mm) as the first horizontal lenslet array 340. It is placed near the focus of the first horizontal lenslet array 340 and makes an image of the first horizontal lenslet array 330 on the homogenized plane 390, thereby making the edges of the illuminated area sharper, so that an almost ideal flat-illuminated area is created.

Of course the horizontal lenslet arrays 340, 360 only homogenize the illumination in the vertical direction. The vertical cylinder lenslet arrays 330, 350 work in the same way and homogenize the beam in the horizontal direction. In a different embodiment the action of a vertical and horizontal lenslet array is combined creating a two-dimensional array of focal spots. However, using cylinder lenslet arrays has advantages: first the manufacturing of high-quality arrays is easier with the one-dimensional arrays, and secondly it is possible to optimize the x and y properties of the beam independently with separate x and y arrays. The arrays used in an embodiment of the invention are refractive arrays made out of quartz, but in a further improvement diffractive components give added freedom to optimize the properties of the homogenized beam. Computer-generated diffractive elements are used in the improved embodiment to reshuffle the beam, so that every part of the input beam is directed to the entire cross-section of the homogenized beam while the beam is shaped to the requirements of the illuminated SLM 30.

In the second beam-shaping step the homogenized beam is expanded and made essentially parallel by lenses 370, 380. It is brought to an illuminator focus with an illuminator stop 700 having a illuminator stop aperture 710 and made parallel again in a relay comprising lenses 740, 750 that images the homogenized plane on the SLM 30. In the homogenized plane 390 there is a field stop aperture 450, an aperture with the shape of the SLM 30 that is imaged on the surface of the SLM 30 to define the illuminated area. The illuminator stop aperture 710 defines the angular spread of the light impinging on the SLM 30 and which is a design parameter. Tuning the size of the illuminator stop aperture 710 improves the resolution and the dimension control in the printed pattern.

The beam conditioning arrangement 20 may have its exit pupil, i.e. a virtual image of the illuminator stop aperture 710 seen through the lens 750, at infinity, which means that a central axis of cones of radiation are parallel. Said object plane coincides with the position of the computer-controlled reticle 30 and in this embodiment said central axis of cones of radiation are parallel in said object plane. From the description above it will be apparent to an optical designer to design a beam conditioning unit, and adapt it to the size and shape of the radiation beam, the size and shape of the computer-controlled reticle and the needed angular spread in the illuminator.

The computer-controlled reticle 30 may be a Spatial Light Modulator (SLM). In this embodiment the SLM comprises all information at a single moment that is required to pattern the whole work piece 60.

Spatial light modulators 30 may be based on reflection or transmission. In the embodiment as shown in FIG. 1 the SLM is a reflective SLM. Reflective Spatial Light modulators come in two varieties, the deflection type and the phase type. The differences between them may in a particular case with micro mirrors seem small, but the phase SLM extinguishes the beam in the specular direction by destructive interference, while a pixel in a deflection SLM deflects the specular beam geometrically to one side so that it misses the aperture of the imaging lens. Typically, the micro mirrors in a deflection SLM move more out of a flat position defined by the surface of a relaxed SLM, where the surface of the micro mirrors is flat, compared to the micro mirrors in a phase SLM. For ultra precise patterning as performed in the current invention the phase SLM is superior to the deflecting type. The deflecting type controls the light through specular reflection and the phase type through diffraction.

First, it has better contrast since all parts of the surface, also hinges and support posts, take part in the destructive interference and total extinction can be achieved.

Second, a system that works by deflecting the radiation to the side is difficult to make symmetric around a optical axis at intermediate deflection angles, creating a risk of feature instability when focus is changed. The phase SLM can be built with micro machined mirrors, so called micro mirrors, or with a continuous mirror surface on a supporting substrate, where said mirror surface is possible to deform by using an electronic signal.

For example, said continuous mirror may use a viscoelastic layer controlled by an electrostatic field, but it is equally possible, especially for very short wavelengths where deformations of the order of a few nanometers are sufficient, to use a piezoelectric solid disk that is deformed by electric field or another electrically, magnetically or thermally controlled reflecting surface. For the remainder of this application an electrostaticly controlled micro mirror matrix (one- or two dimensional) is assumed, although other arrangements as described above are possible, such as transmissive or reflective SLMs relying on LCD crystals or electro optical materials as their modulation mechanism, or micro mechanical SLMs using piezoelectric or electrostrictive actuation. In various embodiments, the computer-controlled reticle may be a device referred to as a deflecting micro mirror device, a grating light valve, a silicon light valve or a liquid crystal modulator. The SLM could modulate the phase or intensity of the radiation or the pulse length of exposing radiation.

The SLM 30 is a programmable device that produces an output radiation beam that is modulated by separate inputs from a computer. The SLM 30 simulates the function of a mask through the generation of bright and dark pixels in response to computer fed data. For example the phase SLM 30 is an array of etched solid-state mirrors. Each micro mirror element is suspended above a silicon substrate by restoring hinges, for example restoring hinges, which may be supported either by separate support posts or by the adjacent mirrors. Beneath the micro mirror element are address electrodes. One micro mirror represents one pixel in the object plane. The pixel in the image plane is here defined as to have the same geometry as the micro mirror but the size may be different due to the optics, i.e. larger or smaller depending on if the optics is magnifying or demagnifying.

The micro mirror and the address electrodes act as a capacitor so that for example a negative voltage applied to the micro mirror, along with a positive voltage to the address electrode, will twist the torsion hinges suspending the micro mirror which in turn allow the micro mirror to rotate or to move up or down, thereby creating a phase difference. Depending on the voltage applied the rotation or up and down movement of the micro mirror may take any state between flat to fully rotated or flat to an entirely down or up position. A fully rotated micro mirror having an essentially square surface with its sides approximately 16 mm long is typically 8 mRad. A micro mirror which moves up and down moves typically 0.1 mm between said flat and said entirely down position. The periodic pattern of pixels create diffraction orders and the position of a mirror determines how much of the radiation energy goes into each order.

A projection system comprises in this embodiment the third lens arrangement 40, which may be a compounded tube lens, a spatial filter 70 and the first lens arrangement 50. The third lens arrangement 40 and the spatial filter 70 forms together what is generally called a Fourier filter. The third lens arrangement 40 projects the diffraction pattern onto the spatial filter 70. The first lens arrangement 50, which may be a compounded final lens, forms the aerial image on the work piece 60.

The spatial filter 70 is in this embodiment an aperture in a plate. Said aperture being sized and positioned so as to block out essentially every diffraction order which is diffracted into the first and higher diffraction orders, for example said aperture may be located at the focal distance from the third lens arrangement 40. The reflected radiation is collected by said third lens arrangement 40 in the focal plane, which acts at the same time as a pupil plane of the first lens arrangement 50. The aperture cuts out the light from the first and higher diffraction orders of the addressed micro mirrors in the SLM, while the radiation from the non-addressed mirror surfaces can pass the aperture. The result is an intensity modulated aerial image on the work piece 60 as in conventional lithography. For an optimum dark image area the diffraction pattern should only contain light in the first and higher diffraction orders without any radiation in the zeroth order.

The first lens arrangement 50 has in this embodiment its exit pupil focused at infinity, i.e. central axis of cones of radiation in a image plane defined by the position of the work piece 60 are parallel.

In another embodiment said central axis of cones of radiation in an image plane defined by the position of the work piece 60 are essentially parallel within a range, which is defined as a restriction or a requirement that the lateral movement of a feature, to be written on the work piece, is insignificant when the work piece moves through focus by a permissible defocus amount. A typical example would be that the work piece is allowed to move ±50 nm out of focus and that the central axis of cones of radiation should be parallel within 50 mRad or better, giving a lateral movement of features in the written pattern of 5 nm.

Figure 6:
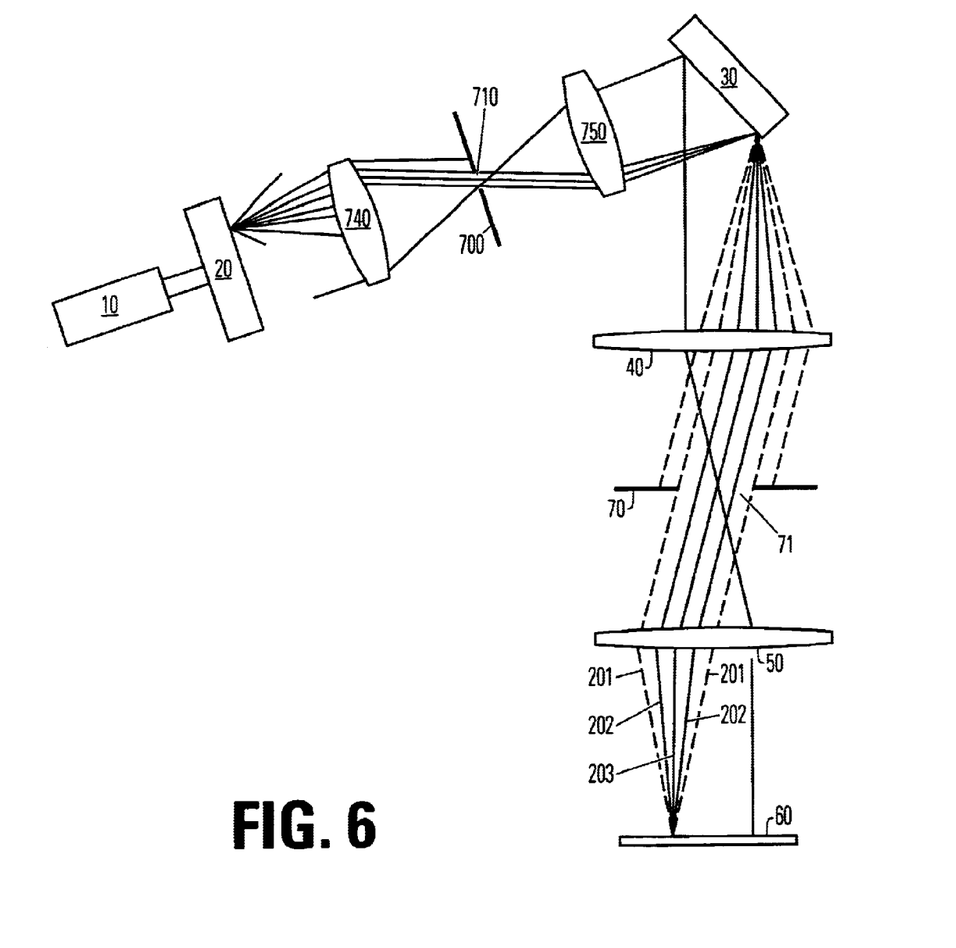
FIG. 6 shows the cones of light from a beam conditioning arrangement to a work piece via an optical system.

However, it is not enough to make the light cones defined by the aperture stop (spatial filter) 70 perpendicular to the work piece in order to make the image stable through focus. There is also another set of light cones defined by the illuminator stop seen through the optics and reflected in the SLM 30. This set of cones must also be perpendicular to the work piece. FIG. 6 shows the two sets of cones 201, 202 and how they are constructed from the optical drawing. Cone 201 represents a cone from a spatial filter aperture 71 in a spatial filter 70 and a cone 202 represents a cone from an illuminator stop aperture 710 in a illuminator stop 700. Note that in the general case the illumination of the SLM 30 need not be by parallel light and the SLM 30 need not even be curved (e.g. due to manufacturing imperfections), but the beam conditioner unit 20 can be adjusted to make the light cones defined by the illuminator stop 700 be perpendicular to the work piece 60 and parallel to each other. The central axis of cones of radiation 203 is in this embodiment perpendicular to the work piece 60. In the embodiment shown in FIG. 6 only one central axis of cones of radiation is shown for clarity reasons, however there are many central axis of cones of radiation and all of them are parallel or at least essentially parallel with each other.

The concept of cones must be taken in a broad sense. The illuminator stop 700 need not have a sharp edge or the angular subtense of the illumination radiation may have a Gaussian distribution. Such soft-limited illumination has been found to be beneficial for the image quality, and can be created by a graytone mask as the illuminator stop 700 or by using a diffuser 430, see FIG. 5, in the beam path. In the case of cones of light with non-uniform illumination a symmetry axis can be found, or in complicated cases computed using optical theory or a commercial optical analysis program such as GLAD or ZEMAX.

If in a hypothetical case these two sets of cones were not both perpendicular to the surface of the work piece 60, and the work piece 60 was moved slightly out of focus, the printed features would be displaced relative to their intended position. If the two sets of light cones were not parallel small and large features were even displaced by different amounts, causing the pattern to be distorted. This pattern displacement and distortion when the focus setting is changed are in fact indications that the axes of the two sets of cones are not parallel and are used for diagnosing and adjusting the optics. The axis of the light cones defined by the lens stop aperture 810 in the lens stop 800 is in most cases determined by the design and manufacturing tolerances of the lens unit, since the stop is typically located inside the lens assembly 820, 840. The cone defined by the illumination optics may have to be tuned due to inevitable alignment tolerances and component imperfections, e.g. non-flatness of the SLM 30. The adjustment is by lateral and longitudinal movement of the illuminator aperture 710, although in other embodiments it is advantageous to adjust other components, in particular the relay lenses 740, 750 in the illuminator. In the adjustment procedure, a test pattern is printed with small and large features at different focus settings. The displacement of the printed features is measured relative to reference features printed at constant focus. Measured displacements are used to infer the error direction and magnitude at different locations in the field and corrections are calculated and applied. The procedure can be repeated until the tuning is deemed satisfactory.

Note that in the general case it is not necessary that the cones of light illuminating the SLM 30 are parallel. In embodiments where the optical axis is perpendicular to the SLM 30 the SLM 30 can work in a divergent or convergent light beam as long as the projection optics adjusts for it and create the condition of parallel light cones on the work piece 60. Where there is an oblique angle between the optical axis and the SLM 30 as shown in FIGS. 1a and 1b the parallel condition must be maintained also at the SLM or else a trapezoid error will result.

The work piece 60 may be a substrate with a photosensitive surface which substrate for example will be a photomask for semiconductor devices and display panels. It may also be semiconducting wafer coated with a photosensitive layer for production of Integrated circuits. Since the present invention not only have applications in direct patterning of semiconductor device patterns, display panels, integrated optical devices and electronic interconnect structures, it can also have applications to other types of patterning such as security patterning. The term patterning should be understood in a broad sense, meaning exposure of photoresist and photographic emulsion, but also the action of radiation on other radiation sensitive media such as dry process paper, by ablation or chemical processes activated by radiation or heat. The present invention may also find application in wafer repairing, wherein a processed wafer is reprocessed with the radiation beam.

Figure 1B:
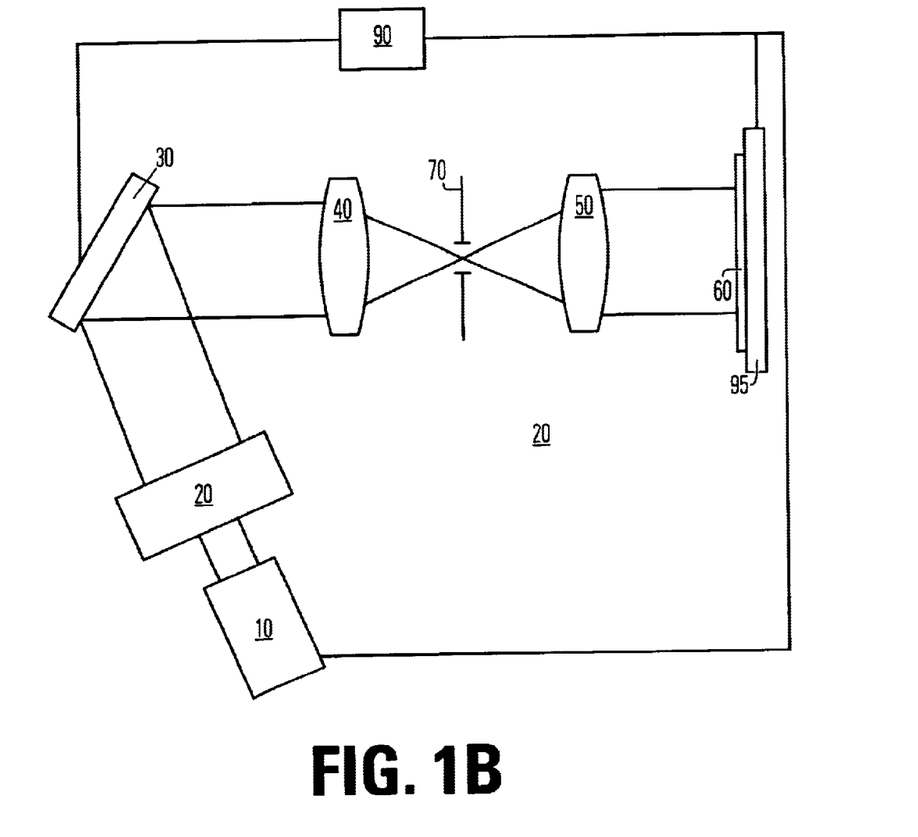
FIG. 1b shows a second embodiment of an apparatus for patterning a work piece according to the present invention.

FIG. 1b shows a second embodiment of an apparatus 100 for patterning a work piece 60 according to the present invention. This second embodiment comprises in addition to what was described in relation to FIG. 1a a control unit 90 and a moving stage 95 upon which the work piece 60 rests. The control unit 90 comprises a data processing and delivery system for receiving a digital description of the pattern to be patterned on said work piece 60 and for feeding said description to the computer-controlled reticle 30 and a control system for controlling the positioning of said work piece 60 and/or projection system relative to each other, the feeding of said digital description to said computer-controlled reticle 30 and the intensity or other property of the radiation, such as phase or pulse duration, so that said pattern is patterned on said work piece 60.

The radiation source 10 may for example be a pulsed laser with a characteristic wavelength that is compatible with the spectral sensitivity of a selected photoresist. The pulsed beam has a repetition rate that is timed to be synchronous with the data stream that configures the computer-controlled reticle and with the moving stage. The radiation source 10 may operates at a repetition rate that is close to the rate at which the computer-controlled reticle 30 are capable of switching from one pattern to another, in order to maximize throughput.

Since the work piece 60 rests on a moving stage 95 which moves at a constant velocity, each pulse that illuminates the computer-controlled reticle 30 and is imaged onto the work piece 60 will illuminate a different part of the work piece 60. The computer-controlled reticle 30 which for example may be a SLM operates so that the entire array of micro mirrors can be reconfigured for each pulse to form the correct image on the work piece 60.

At first, binary pattern from a CAD layout is transformed into a binary or analog data set of SLM data. The data is transferred to the SLM, where the built in control electronics causes a number of micro mirrors to change position. Thereby, the non-addressed pixels represent bright regions on the work piece. Every cone of radiation in a specific image pixel as defined previously in said image plane corresponds to a specific object pixel in said computer-controlled reticle 30, which for example may be a single micro mirror.

As the stage 95 moves at constant velocity the work piece 60 is radiated by a beam pattern. The pattern imaged onto the work piece 60 at any given moment represents a particular orientation of the individual mirrors in the SLM. By the next time the radiation pulse radiates the work piece 60, the stage 95 has moved by an amount that is for example a fraction of the width of the radiating beam. Each point of the work piece 60 that is to be patterned is radiated at least once by the pulses of the radiation. In order to overcome stitching problems with adjacent patterns that is radiated onto the work piece 60 each point of the work piece 60 that is to be patterned is radiated by at least two different pulses as the stage carries the work piece 60. The number of pulses that radiates a certain point on the work piece 60 is determined by the repetition rate of the radiation source 10, the speed of the stage 95, and the size of the radiated area.

Figure 2A:
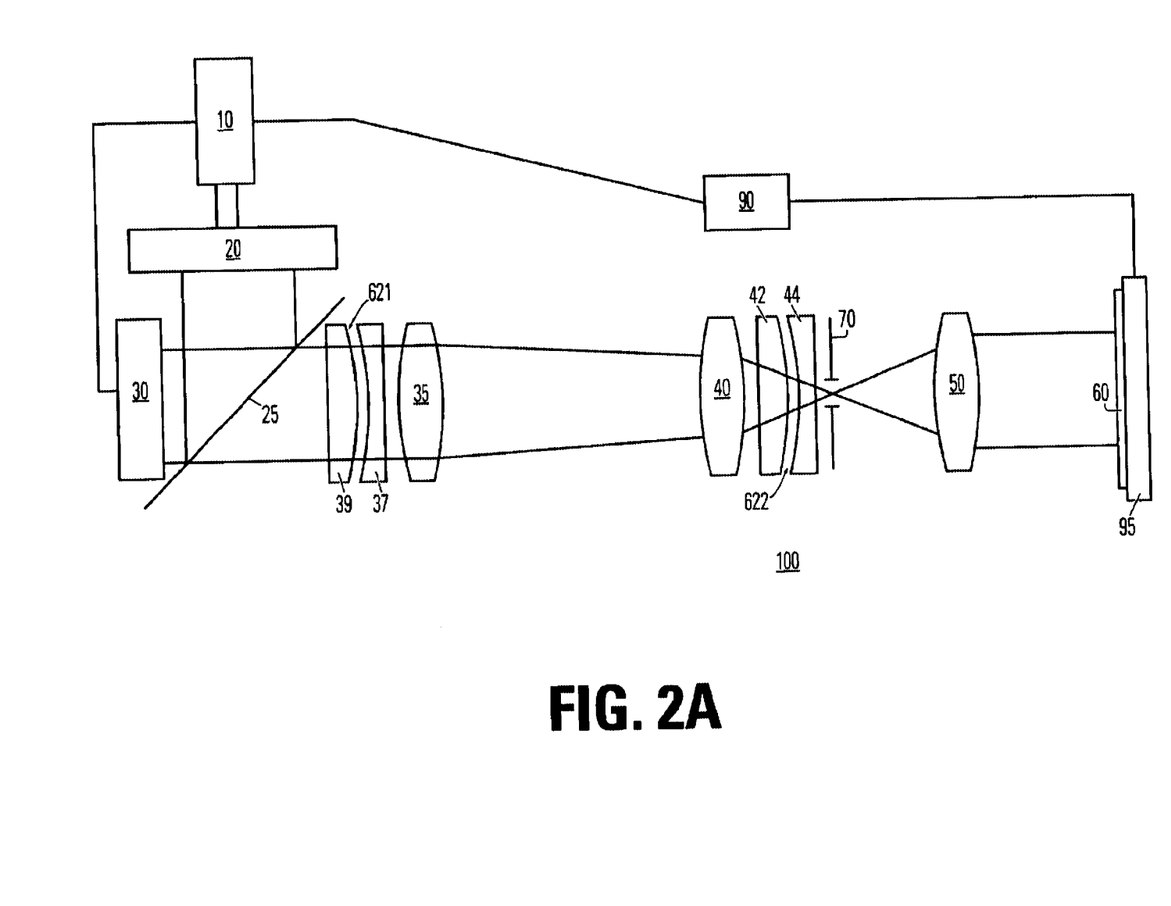
FIG. 2a shows a third embodiment of an apparatus for patterning a work piece according to the present invention.

FIG. 2a shows a third embodiment of an apparatus 100 for patterning a work piece 60 according to the present invention. This third embodiment comprises in addition to what was described in relation to FIG. 1a or 1b a beam splitter 25 and a fourth lens arrangement 35. The beam splitter 25 is a semi-transparent device which reflects radiation a part of the incident radiation and transmits the rest of the incident radiation depending on the angle of incidence. Here, in this embodiment, the beam splitter 25 is arranged between the computer-controlled reticle 30 and the fourth lens arrangement 35. In an alternative embodiment as shown in FIG. 2b said beam splitter 25 is arranged between said fourth lens arrangement and said third lens arrangement 40.

Figure 2B:
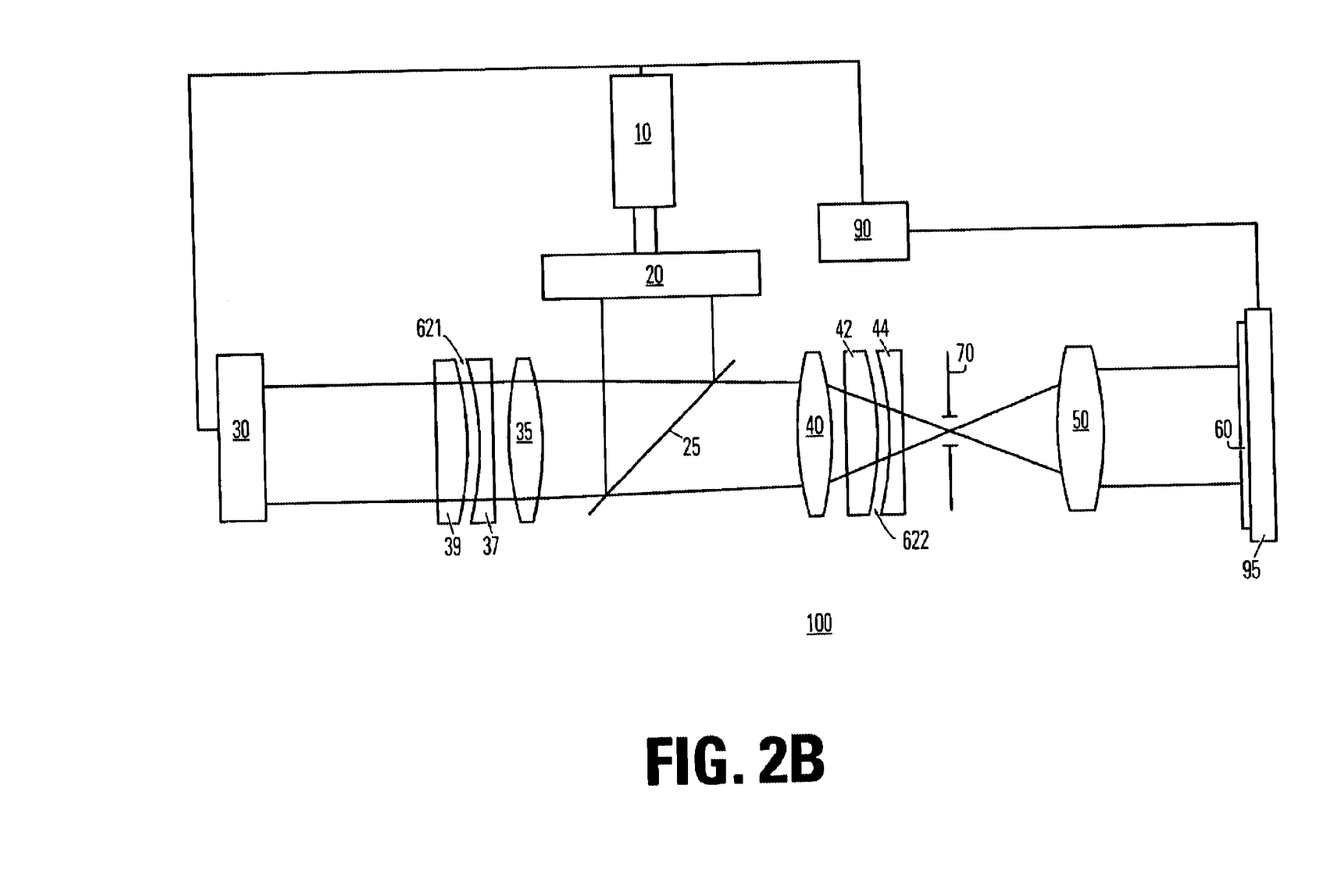
FIG. 2b shows a fourth embodiment of an apparatus for patterning a work piece according to the present invention.
Figure 2C:
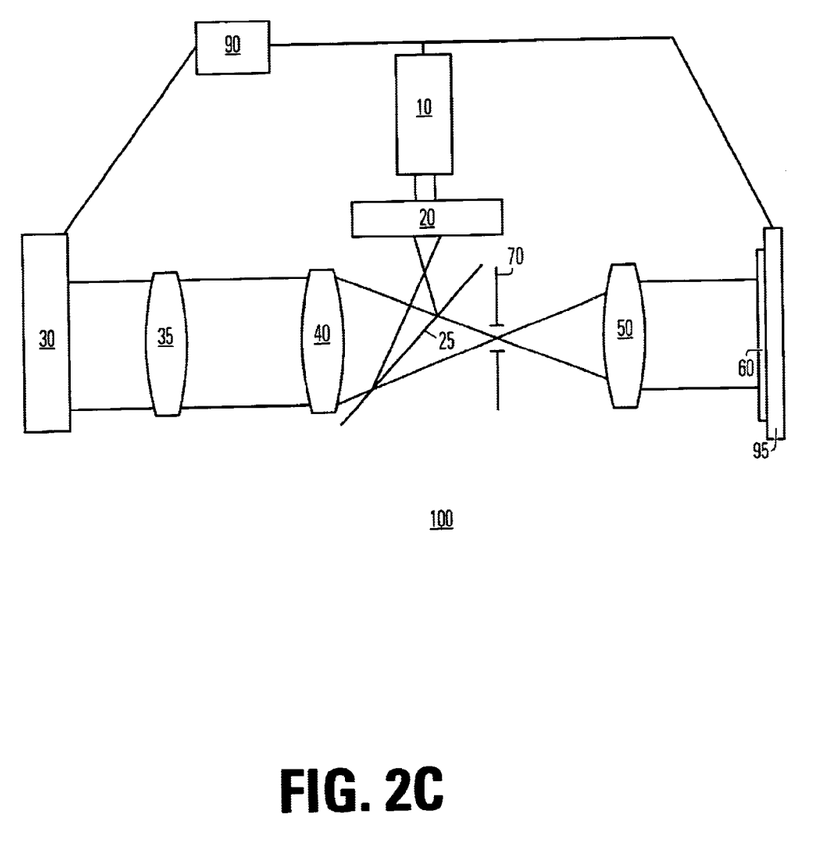
FIG. 2c shows a fifth embodiment of an apparatus for patterning a work piece according to the present invention.

In an alternative embodiment as shown in FIG. 2c said beam splitter 25 is arranged between or inside said third lens arrangement 40 and said first lens arrangement 50.

Splitting the third lens arrangement 40 and fourth lens arrangement 35 in two or more part as exemplified in for example FIGS. 2a and 2b serves several purposes. First the optical track length can be modified with a given final lens and demagnification, and having multiple elements 35, 37, 39 and 40, 42, 44 gives considerable flexibility to cope with other boundary conditions, e.g. that lens elements cannot be placed at the corners of a folded beam path. By changing the distance between the fourth lens arrangement 35, which may be a compounded field lens, and the third lens arrangement 40, which may be a compounded tube lens, the magnification on the work piece 60 can be changed without changing the distance between the computer-controlled reticle 30 and the work piece 60. This is advantageous since said distance between said computer-controlled reticle 30 and said work piece 60 is almost always fixed and hard to change due to restrictions in a housing surrounding said apparatus 100.

Secondly, having several lens arrangements makes it possible to adjust the demagnification to account for air pressure changes and component variation. There are essentially three parameters to set in the projection system: demagnification, focus and beam pointing. Movement of two lenses plus a refocus of the final lens, i.e. the first lens arrangement 50, can change one of them while keeping the other two constant, e.g. for changing magnification. The lens arrangements are moved by motorized mechanisms and the machine control computer has a preprogrammed function which moves the lens arrangements by the right amounts to change the magnification only. When a significant change in barometric pressure occurs, the computer moves the elements to maintain focus and demagnification. In the simplest case it has a programmed precomputed air pressure vs. correction table that it uses. In a more developed scheme the size of the exposure field and the focal position are measured and corrections are computed and applied.

A third benefit of splitting the third lens arrangement is that it gives improved ability to correct for aberrations. Lenses close to the spatial filter 70 in the Fourier plane mainly affect the image acuity, while lenses close to an object or image plane mainly affect field aberrations such as distortion and field curvature.

It is difficult to align and adjust the lens system outside of the apparatus for patterning a work piece to the precision needed, and even more difficult to install an optical system without disturbing the performance. On the other hand, once the apparatus writes it is easy to quantify aberrations in the printed images of test patterns. The test patterns are measured in a metrology system such as the Leica LMS-IPRO made by Leica in Wetzlar, Germany. A suitably split and compounded lens system can be adjusted so that the aberrations are removed or compensated. Regardless of the origin of the aberrations the lens arrangements of a properly designed machine can be moved to correct for low-order aberrations, such as field curvature, third-order distortion and trapezoid error.

FIG. 2a and FIG. 2b shows a first compounded lens arrangements 35, 37, 39, and a second compounded lens arrangement 40, 42, 44 which can correct for spherical aberration SA, on-axis coma, third-order distortion and trapezoid error. The two compound groups each having an "air meniscus" with low power 621 and 622. The symmetrical aberrations SA and distortion are corrected by axial shifts of elements 37 and 39 in the first compounded lens arrangement and/or by axial shifts of elements 42 and 44 in the second compounded lens arrangement. The non-symmetrical aberrations, on-axis coma and trapezoid error are corrected by decentering the parts 37, 39 in the first compounded lens arrangement and/or by decentering the parts 42, 44 in the second compounded lens arrangements thereby deforming the air meniscus 621, 622.

The measured aberrations are compared to the results of ray-tracing the optical path and an equivalent shift and decentering of the elements is derived, typically by a non-linear optimization algorithm that can be found in most textbooks on numerical optimization. Other possibilities exist, such as using a generic algorithm or a linear perturbation method. The elements are shifted and decentered to correct for the aberrations and the procedure is typically repeated a few times until no further improvement is obtained. This is repeated as often as is deemed necessary, typically at major maintenance intervals. The shown lens designs are only an example. A component optical designer can device similar compounded optical trains for correcting the same and other aberrations.

Figure 3:
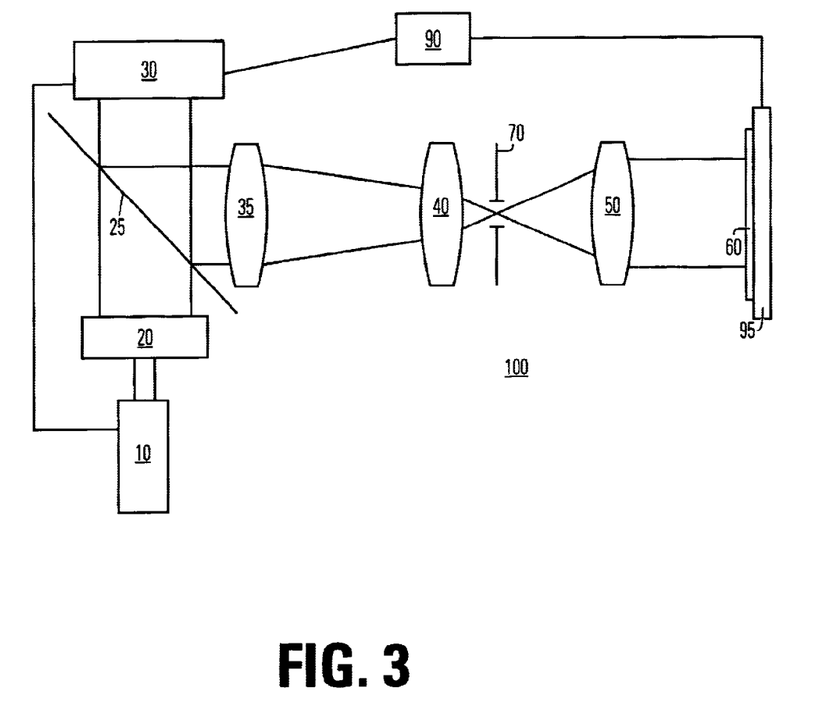
FIG. 3 shows a sixth embodiment of an apparatus for patterning a work piece according to the present invention.

In an alternative embodiment as shown in FIG. 3 said beam splitter 25 is arranged in a radiation path between the radiation source 10 and the computer-controlled reticle 30. Instead of, as shown in the embodiments in FIGS. 2a, 2b and 2c, first reflecting the radiation by the beam splitter 25 then reflecting and diffracting the same radiation by the computer-controlled reticle 30 and thereafter transmitting said radiation through said beam splitter 25, the radiation is here first transmitted through said beam splitter 25 then reflected and diffracted by the computer-controlled reticle and thereafter reflected by the beam splitter 25. This embodiment is advantageous since the pattern from the computer-controlled reticle 30 is almost undisturbed due to the fact that said radiation is reflected by the beam splitter 25. In the embodiments shown in FIGS. 2a, 2b and 2c the pattern may be disturbed due to the fact that the pattern must travel through two surfaces of the beam splitter 25, which surfaces may not be absolutely flat.

In the embodiment as shown in FIG. 3 the surfaces of the beam splitter may be parallel or non parallel. The advantage of having a beam splitter with non parallel surfaces is that a so called ghost image, caused by the reflection of the back surfaces of the beam splitter, can be arranged to fall outside the wanted image to be printed on the work piece.

Figure 4:
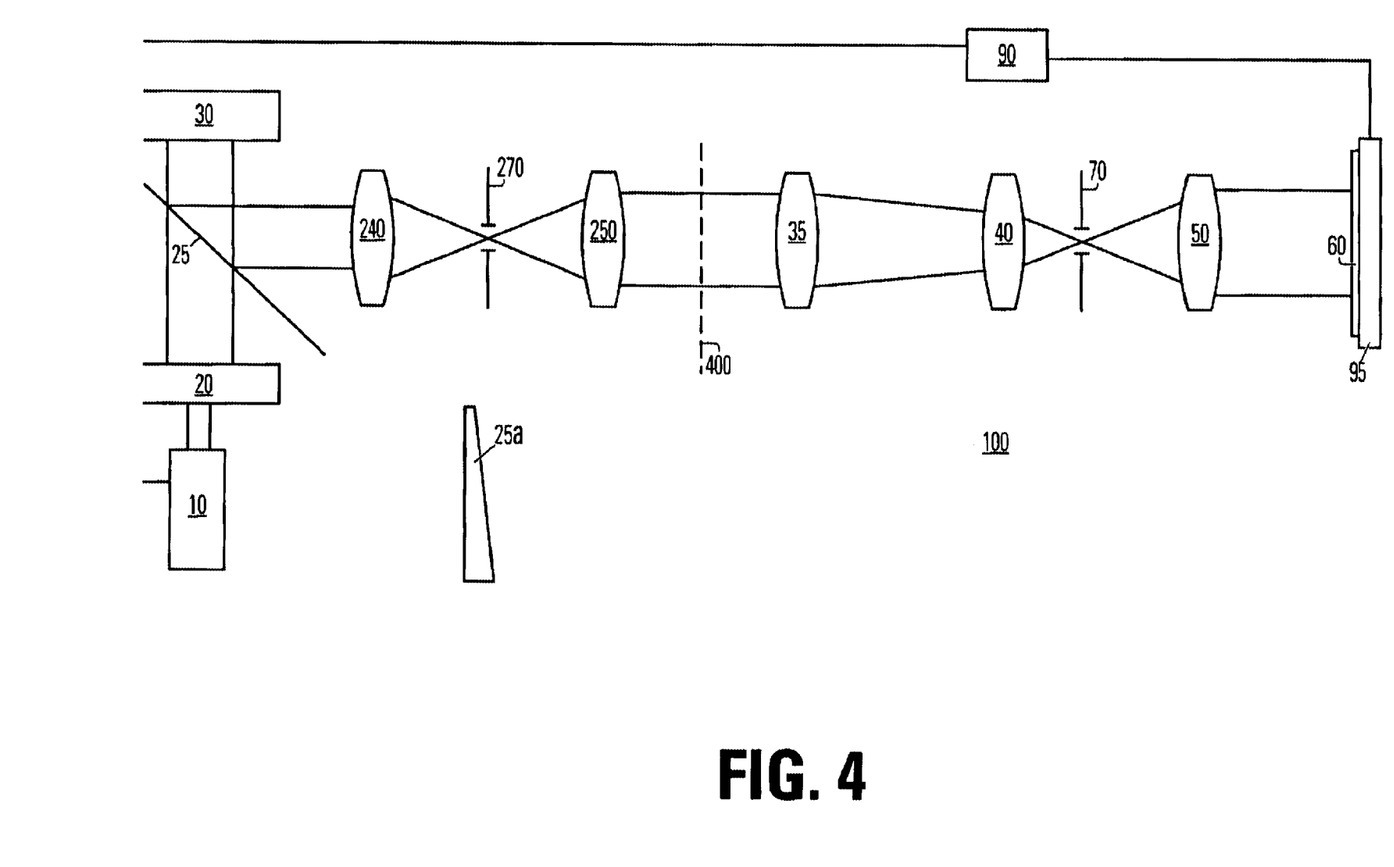
FIG. 4 shows a seventh embodiment of an apparatus for patterning a work piece according to the present invention.

FIG. 4 shows a seventh embodiment of an apparatus 100 for patterning a work piece 60 according to the present invention. This seventh embodiment comprises in addition to what was described in relation to any of the previous embodiments a relay system comprising a first relay lens 240, a spatial filter 270 and a second relay lens 250. Said relay system elongates the radiation path from the computer-controlled reticle 30 to the work piece 60. This could be advantageous in some cases where one wants for example to separate the computer controlled reticle from the work piece, for instance due to contamination effects, heat effect and/or vibrating effects.

Said relay system provides an intermediate focus which can be used for another Fourier filter. The advantage of having another Fourier filter in said relay system is that said Fourier filter is more easily adjusted compared to the Fourier filter in the position as described in the previous embodiments. Said relay system also provides an intermediate image plane 400.

In the embodiments described in relation to FIGS. 2a, 2b, 2c, 3 and 4 above a ¼-wave plate may be arranged in the radiation path between said computer-controlled reticle 30 and said beam splitter 25. Said ¼-wave plate will rotate the polarization of the light so that said transmission or reflection by said beam splitter 25 may be more efficient. The beam from the electromagnetic radiation source is polarized so that essentially all radiation is reflected by or transmitted through said beam splitter before said radiation impinges on said computer-controlled reticle and is transmitted twice through said ¼-wave plate. When the radiation thereafter is transmitted through or reflected by said beam splitter said ¼-wave plate has rotated the polarization of the radiation so that the beam splitter will act differently because of the changed polarization.

Thus, although there has been disclosed to this point particular embodiments of the apparatus for patterning a work piece, it is not intended that such specific references be considered as limitations upon the scope of this invention except in-so-far as set forth in the following claims. Furthermore, having described the invention in connection with certain specific embodiments thereof, it is to be understood that further modifications may suggest themselves to those skilled in the art, it is intended to cover all such modifications as fall within the scope of the appended claims.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. An apparatus (100) for patterning a work piece (60) arranged at an image plane and sensitive to electromagnetic radiation, comprising:

a source (10) emitting electromagnetic radiation onto an object plane;

a computer-control led reticle (30) comprising a plurality of object pixels, adapted to receive said electromagnetic radiation at said object plane and to relay said electromagnetic radiation toward said work piece (60); and an optical projection system comprising a Fourier filter adapted to filter said relayed electromagnetic radiation in a Fourier space and a first lens arrangement (50) adapted to project essentially parallel central axes of cones of radiation onto said image plane.

2. The apparatus of claim 1, wherein the cones of radiation in a specific pixel in said computer-controlled reticle (30) are projected on a corresponding specific pixel in said image plane.

3. The apparatus according to claim 1, further comprising a beam conditioner unit (20) having an exit pupil focused at infinity.

4. The apparatus according to claim 3, wherein said Fourier filter comprises a third lens arrangement (40) and a spatial filter (70) adapted to block out essentially all first and higher order diffractions of the relayed electromagnetic radiation.

5. The apparatus according to claim 4, wherein the spatial filter is adapted by its size and position.

6. The apparatus according to claim 4, wherein said spatial filter (70) is an aperture in a plate.

7. The apparatus according to claim 1, wherein said Fourier filter comprises a third lens arrangement (40) and a spatial filter (70) adapted to block out essentially all first and higher order diffractions of the relayed electromagnetic radiation.

8. The apparatus according to claim 7, wherein the spatial filter is adapted by its size and position.

9. The apparatus according to claim 7, wherein said spatial filter (70) is an aperture in a plate.

10. The apparatus according to claim 9, further comprising a ¼-wave plate arranged in the radiation path between said computer-controlled reticle and said beam splitter.

11. The apparatus according to claim 9, wherein said beam splitter (25) having a first surface and a second surface that are not parallel.

12. The apparatus according to claim 9, wherein said beam splitter (25) having a first surface and a second surface that are parallel.

13. The apparatus according to claim 1, further comprising a beam splitter (25) arranged anywhere in a radiation path between said computer-controlled reticle (30) and said first lens arrangement (50).

14. The apparatus according to claim 13, wherein said electromagnetic radiation is transmitted through said beam splitter (25) before it is relayed by said computer-controlled reticle (30) or reflected by said beam splitter (25).

15. The apparatus according to claim 13, wherein said electromagnetic radiation is reflected by said beam splitter (25) before it is relayed by said computer-controlled reticle (30) or transmitted through said beam splitter (25).

16. The apparatus according to claim 1, wherein said computer-controlled reticle (30) is a Spatial Light Modulator (SLM).

17. The apparatus according to claim 1, wherein said computer-controlled reticle (30) is a deflecting micro mirror device.

18. The apparatus according to claim 1, wherein said computer-controlled reticle (30) is a grating light valve.

19. The apparatus according to claim 1, wherein said computer-controlled reticle (30) is a silicon light valve.

20. The apparatus according to claim 1, wherein said computer-controlled reticle (30) is a liquid crystal modulator.

21. The apparatus according to claim 1, wherein said source for emitting electromagnetic radiation (10) is a continuous radiation source.

22. The apparatus according to claim 21, wherein said source for emitting electromagnetic radiation (10) is a laser source.

23. The apparatus according to claim 1, wherein said source for emitting electromagnetic radiation (10) is a pulsed radiation source.

24. The apparatus according to claim 23, wherein said source for emitting electromagnetic radiation (10)is a laser source.

25. The apparatus according to claim 1, further comprising:

a stage (95) upon which the work piece (60) rests for positioning said work piece (60) and said projection system relative to each other; and a control system adapted to position said work piece (60) and projection system relative to each other, to feed a digital description of a pattern to be projected on said work piece (60) to said computer-controlled reticle (30) and to modulate the electromagnetic radiation.

26. The apparatus according to claim 1, wherein the essential parallel central axes of the cones are parallel within about 50 mRad.

27. A method for patterning a work piece arranged at an image plane and sensitive to electromagnetic radiation, comprising the actions of:

emitting electromagnetic radiation from a source onto a computer-controlled reticle at an object plane;

relaying and diffracting said electromagnetic radiation from the computer-controlled reticle towards said work piece;

filtering in a Fourier space the relayed and diffracted electromagnetic radiation;

transforming the relayed and diffracted electromagnetic radiation to have essentially parallel central axes of cones of radiation when it impinges on the work piece.

28. The method according to claim 27, further comprising the action of conditioning the electromagnetic radiation to have essentially parallel central axes of cones of radiation when it impinges on the computer-controlled reticle.

29. The method according to claim 28, further comprising the action of splitting the electromagnetic radiation with a beam splitter placed between said computer-controlled reticle and any lens.

30. The method according to any one of claim 29, further comprising the action transmitting the electromagnetic radiation through a ¼-wave plate placed between said computer-controlled reticle and said beam splitter.

31. The method according to claim 27, further comprising the action of splitting the electromagnetic radiation with a beam splitter placed between said computer-controlled reticle and any lens.

32. The method according to claim 31, further comprising the action of transmitting said electromagnetic radiation through said beam splitter before it is relayed and diffracted by said computer-controlled reticle and reflected by said beam splitter.

33. The method according to any one of claim 32, further comprising the action transmitting the electromagnetic radiation through a ¼-wave plate placed between said computer-controlled reticle and said beam splitter.

34. The method according to claim 31, further comprising the action of reflecting said electromagnetic radiation with said beam splitter before it is relayed and diffracted by said computer-controlled reticle and transmitted through said beam splitter.

35. The method according to any one of claim 34, further comprising the action transmitting the electromagnetic radiation through a ¼-wave plate placed between said computer-controlled reticle and said beam splitter.

36. The method according to any one of claim 31, further comprising the action transmitting the electromagnetic radiation through a ¼-wave plate placed between said computer-controlled reticle and said beam splitter.

37. The method according to claim 27, further comprising the actions of:
  positioning a stage supporting said work piece and relative to a path of said electromagnetic radiation;
  feeding a digital description of an image to be projected to the computer-controlled reticlel; and
  controlling intensity of said electromagnetic radiation impinging on the work piece.

38. An apparatus (100) for patterning a work piece (60) arranged at an image plane and sensitive to electromagnetic radiation, comprising:
  a source (10) for emitting electromagnetic radiation,
  a beam conditioner unit that directs said electromagnetic radiation onto an object plane, oriented so that, at each point in the object plane, there is a predetermined angular spread between a central axis of the electromagnetic radiation and the object plane;
  a computer-controlled reticle at the object plane adapted to modulating the radiation at each of a multitude of pixels in accordance to an input pattern description; and
  a projection system for projecting the electromagnetic radiation from said computer-controlled reticle onto a work piece, said electromagnetic radiation oriented so that, at each point in the image plane, there is essentially a right angle between said central axis and the image plane.

39. The apparatus according to claim 38, where the exit pupil of the projection system is focused at infinity.

40. The apparatus of claim 39, further including a beam splitter positioned between a stop defining the exit pupil of the beam conditioner unit and the computer-controlled reticle.

41. The apparatus according to claim 38, where the radiation is spatially filtered is a Fourier space between the computer controlled reticle (30) and the work piece (60).

42. The apparatus according to claim 39, where said exit pupil is centered on an optical axis of the projection system.

43. An apparatus (100) for patterning a work piece (60) arranged at an image plane and sensitive to electromagnetic radiation, comprising:
  a source (10) for emitting electromagnetic radiation;
  a beam conditioner unit that expands and homogenizes said electromagnetic radiation and illuminates an object plane with essentially uniform intensity and angular spread;
  a computer-controlled reticle at the object plane adapted to modulate the electromagnetic radiation at a multitude of pixels in accordance to an input pattern description; and
  a projection system to project an image of said reticle onto a work piece with essentially uniform intensity across the work piece and with a path of the electromagnetic radiation that is essentially normal to a surface of the work piece.

44. The apparatus according to claim 43, where the exit pupil of the projection system is focused at infinity.

45. The apparatus according to claim 44, wherein said exit pupil is centered on an optical axis of the projection system.

46. The apparatus of claim 44, further including a beam splitter positioned between any lens and the computer-controlled reticle.

47. The apparatus according to claim 43, wherein the exit pupil of the beam conditioner unit (20) is focused at infinity.

48. The apparatus according to claim 47, wherein said exit pupil is centered on an optical axis of the projection system.

49. The apparatus according to claim 43, where the exit pupil of the beam conditioner unit is focused at a finite distance.

50. The apparatus according to claim 43, wherein the computer-controlled reticle is positioned to form an oblique angle between its surface and an optical axis of electromagnetic radiation impinging on the surface.

51. The apparatus according to claim 43, wherein the computer-controlled reticle is essentially perpendicular to an optical axis of the projection system and said apparatus further comprises a beam splitter transmissive to the electromagnetic radiation emitted onto the computer-controlled reticle and reflective to the electromagnetic radiation relayed by the computer-controlled reticle.

52. The apparatus according to claim 43, where the exit pupil of the beam conditioner unit is focused at infinity.

53. The apparatus according to claim 43, further including a spatial filter operating in a Fourier space positioned between the computer controlled reticle (30) and the work piece (60).

54. The apparatus according to claim 53, wherein the exit pupil of the beam conditioner unit (20) is focused at infinity.

55. The apparatus according to claim 53, where the exit pupil of the projection system is focused at infinity.

56. The apparatus of claim 55, further including a beam splitter positioned between any lens and the computer-controlled reticle.

57. The apparatus according to claim 53, wherein the computer-controlled reticle is essentially perpendicular to an optical axis of the projection system and said apparatus further comprises a beam splitter transmissive to the electromagnetic radiation emitted onto the computer-controlled reticle and reflective to the electromagnetic radiation relayed by the computer-controlled reticle.

58. The apparatus according to claim 57, further comprising a ¼-wave plate positioned between the beam splitter and the computer-controlled reticle.

59. An apparatus (100) for patterning a work piece (60) arranged at an image plane and sensitive to electromagnetic radiation, comprising:
  a source (10) for emitting a beam of electromagnetic radiation,
  a beam conditioner unit illuminating an object plane, said unit having an illuminator stop (700) defining the angular spread of the illumination radiation,
  a computer controlled reticle at the object plane adapted to modulating the properties of the radiation at each of a multitude of pixels in accordance to an input pattern description, and a projection system for creating a projected image of said reticle onto a work piece, said system having a spatial filter (70) stop, wherein the illuminator stop and the spatial filter stop define exit pupils which are essentially concentric.

60. The apparatus according to claim 59, wherein the spatial filter operates in a Fourier space and is placed between the computer controlled reticle (30) and the work piece (60).

61. The apparatus according to claim 59, wherein the exit pupils are centered relative to each other.

62. The apparatus according to claim 59, wherein the exit pupils are centered relative to an optical axis of the projection system.

63. An apparatus (100) for patterning a work piece (60) arranged at an image plane and sensitive to electromagnetic radiation, comprising:

a source (10) emitting electromagnetic radiation, illuminating an object plane;

a computer-controlled reticle at the object plane adapted to modulate the electromagnetic radiation at a multitude of pixels in accordance to an input pattern;

a projection system adapted to project an image of said reticle onto a work piece with a predetermined demagnification, said demagnification being adjustable.

64. The apparatus according to claim 63, further including a compound field lens (35, 37, 39) having movable elements, wherein an image distortion at the work piece is adjustable through movement of the elements.

65. The apparatus according to claim 64, wherein the compound field lens includes an air meniscus, the shape of which can be changed.

66. The apparatus according to claim 63, further including a compound tube lens (40, 42, 44) having movable elements, wherein spherical aberration and on-axis coma errors are adjustable through movement of the elements.

67. The apparatus according to claim 66, wherein the compound tube lens includes an air meniscus, the shape of which can be changed.

68. A method for patterning a work piece arranged at an image plane and sensitive to electromagnetic radiation, comprising the actions of:

emitting electromagnetic radiation from a source;

conditioning the electromagnetic radiation to have essentially parallel cones of radiation as it impinges on a beamsplitter;

relaying the conditioned electromagnetic radiation from or through the beamsplitter onto a computer-controlled reticle at an object plane;

relaying and diffracting said conditioned electromagnetic radiation from the computer-controlled reticle towards said work piece;

filtering in a Fourier space the relayed and diffracted electromagnetic radiation;

transforming the relayed and diffracted electromagnetic radiation to have essentially parallel central axes of cones of radiation when it impinges on the work piece.

* * * * *